(12) United States Patent
Kuroki

(10) Patent No.: US 6,563,744 B2
(45) Date of Patent: May 13, 2003

(54) SEMICONDUCTOR MEMORY DEVICE

(75) Inventor: Masaaki Kuroki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/956,457

(22) Filed: Sep. 20, 2001

(65) Prior Publication Data
US 2002/0141245 A1 Oct. 3, 2002

(30) Foreign Application Priority Data
Mar. 29, 2001 (JP) .................................. 2001-096711

(51) Int. Cl.[7] ............................................... G11C 7/00
(52) U.S. Cl. ........................... 365/189.05; 365/189.09; 327/57
(58) Field of Search ...................... 365/189.05, 189.09; 327/57

(56) References Cited

U.S. PATENT DOCUMENTS 5,619,466 A * 4/1997 McClure .................... 365/202
5,754,480 A * 5/1998 Sato ....................... 365/189.05
5,940,331 A * 8/1999 Kagami ................... 365/189.05
6,198,650 B1 * 3/2001 Suh ....................... 365/230.06

* cited by examiner

Primary Examiner—Huan Hoang
(74) Attorney, Agent, or Firm—Volentine Francos, PLLC

(57) ABSTRACT

A semiconductor memory device of which the data output circuit scale is reduced and the data read speed is improved. An output control signal generation portion receives first and second output data determination signals from a sense amplifier and a level shift enable signal. The first and second output data determination signals have complementary logical levels, a maximum internal voltage, and a minimum ground voltage. The maximum voltage of the level shift enable signal is an external voltage and the minimum voltage is the ground voltage. An output portion connected with the output control signal generation portion through respective nodes outputs an output signal from another node. The maximum voltage of the output signal is the external voltage and a minimum voltage is the ground voltage.

20 Claims, 7 Drawing Sheets

SEMICONDUCTOR MEMORY DEVICE

BACKGROUND OF THE INVENTION

1. Field of the Invention

The present invention relates to a semiconductor memory device.

2. Description of Related Art

In the data read operation of a semiconductor memory device such as a Dynamic Random Access Memory (DRAM), the data stored in a memory cell is first transferred to a sense amplifier from the memory cell via a column switch and is then amplified by the sense amplifier. The amplified data is transferred to the data output circuit and is then read out to an external circuit of the semiconductor memory device.

An enable signal is inputted to the data output circuit. If this signal is asserted, the data output circuit takes out the data from the sense amplifier and outputs the data as taken out to the external circuit.

Recently, a variety of researches and developments have been made with regard to the semiconductor memory device for the purposes of reducing the power consumption, increasing the withstand voltage of the gate oxide film in correspondence with the minuteness of the transistor, increasing the withstand voltage between the source and the drain of a transistor, and so forth. As one countermeasure to solve these problems, it has been proposed to use a voltage adjusted to be lower than the power source voltage of the external circuit (referred to as 'external voltage' hereinafter) Vext as the power source voltage of the internal circuit (referred to as 'internal voltage' hereinafter) Vint of the semiconductor memory device, and this proposal is already adopted widely by a variety of semiconductor memory devices.

In the semiconductor memory device of which the internal circuit is formed such that it operates with the internal voltage Vint, the maximum voltage of the data transmitted from the sense amplifier to the output circuit is the internal voltage Vint while the minimum voltage of it is the ground voltage GND. One hand, as the external circuit operates with the external voltage Vext, the conventional art data output circuit is provided with a voltage level shifter for shifting the voltage level of the data received from the sense amplifier from Vint/GND to Vext/GND.

However, in the conventional art semiconductor memory device of the class wherein the complementary data is given to the data output circuit from the sense amplifier, and the read data (output signal) to be outputted to the external circuit is generated from this complimentary data, it has been needed to prepare the level shifter for every complementary data. That is, every data output circuit has to have been provided with two level shifters so far.

The number of the data output circuits corresponds to the number of data bits as read out at a time, that is, the number of data output terminals. When comparing the DRAM of 8-bit I/O type with that of 16-bit I/O type, the number of data output circuits of the former is 8 while the number of data output circuits of the latter becomes 16. As each output circuit is provided with two level shifters, the number of the latter's level shifters becomes larger than the former's level shifters by 16.

As described above, in case of the conventional art semiconductor memory device, especially the one of the type having a lot of I/O terminals, the level shifter has used a considerably larger area in view of the whole layout area of circuit elements in the semiconductor memory device. Accordingly, the level shifters provided for the data output circuit have been one of factors hindering the reduction of the layout area of circuit elements forming the semiconductor memory device.

Furthermore, according to the conventional art semiconductor memory device as described above, the data transmitted from the sense amplifier to the data output circuit has been processed at the level shifter to convert the voltage level of the data and then outputted to the external circuit. In order to shorten the data read time, therefore, it is required to minimize or eliminate the time spent at the level shifter for converting the data voltage level.

The present invention has been made in view of the problems as described above, and the object thereof is to provide a semiconductor memory device which makes it possible to reduce the scale of the data output circuit, and to improve the data read speed.

SUMMARY OF THE INVENTION

In order to solve the problems as described above, according to the first aspect of the invention, there is provided a semiconductor memory device having an output portion (202) and an output control portion (201, 301).

The output portion applies the first power source voltage (Vext) to a read data output node (n232) when the first output control node (n/P) is in the active state, and applies the first power source reference voltage (GND) to the read data output node when the second output control node (n/N) is in the active state.

The output control portion receives the first output data determination signal (D) which makes the power source voltage transition to the second power source voltage (Vint) or the second power source reference voltage (GND) depending on the information stored in the selected memory cell; the second output data determination signal (/D) which makes the power source voltage transition to the second power source reference voltage when the first output data determination signal makes the power source voltage transition to the second power source voltage and makes the power source voltage transition to the second source voltage when the first output data determination signal makes power source transition to the second power source reference voltage; and an enable signal (EN_Vext) making the power source voltage transition to the first power source voltage or the first power source reference voltage. Furthermore, the output control portion makes the first output control node be in the active state when the enable signal makes the power source voltage transition to the first power source voltage and the first output data determination signal makes the power source voltage transition to the second power source voltage, and makes the second output control node be in the active state when the enable signal makes the power source voltage transition to the first power source voltage and the second output data determination signal makes the power source voltage transition to the second power source voltage. Still further, the output control portion includes the first latch means for latching the first output control node in the inactive state and the second latch means for latching the second output control node in the inactive state.

With this structure, it becomes possible to output, from the read data output node, an output signal (DOUT) swinging between the first power source voltage and the first power source reference voltage, based on the first output data determination signal and the second output data determination signal which swing between the second power source voltage and second power source reference voltage.

The output control portion is composed of the first transistor arranged for applying the first power source voltage to the first output control node; the second and third transistors arranged in series for applying the first power source reference voltage to the first output control node; the fourth transistor arranged for applying the first power source voltage to the second output control node; and the fifth and sixth transistors arranged in series for applying the first power source reference voltage to the second output control node. It is preferable that the first, second, fourth, and fifth transistors are on/off controlled by the enable signal, the third transistor is on/off controlled by the first output data determination signal, and the sixth transistor is on/off controlled by the second output data determination signal. With this, the circuit scale of the output control portion can be made smaller.

The first latch means detects that the second output control node is in the active state, and latches the first output control node in the inactive state, and the second latch means detects that the first output control node is in the active state, and latches the second output control node in the inactive state. With this structure, it is prevented that the first and second output control nodes stay in the active state at the same time.

Furthermore, according to the second aspect of the invention, there is provided another semiconductor memory device having an output portion (202) and output control portion (401, 501).

The output portion applies the first power source voltage (Vext) to a read data output node (n232) when the first output control node (n/P) is in the active state, and applies the first power source reference voltage (GND) to the read data output node when the second output control node (n/N) is in the active state.

The output control portion receives the first output data determination signal (D) which makes the power source voltage transition to the second power source voltage (Vint) or the second power source reference voltage (GND) depending on the information stored in the selected memory cell; the second output data determination signal (/D) which makes the power source voltage transition to the second power source reference voltage when the first output data determination signal makes the power source voltage transition to the second power source voltage and makes the power source voltage transition to the second source voltage when the first output data determination signal makes the power source voltage transition to the second power source reference voltage; and an enable signal (EN_Vext) making the power source voltage transition to the first power source voltage or the first power source reference voltage. And also, the output control portion makes the first output control node be in the active state when the enable signal makes the power source voltage transition to the first power source voltage and the first voltage difference is caused between the first output data determination signal and the second output data determination signal, and makes the second output control node be in the active state when the enable signal makes the power source voltage transition to the first power source voltage and the second voltage difference is caused between the first output data determination signal and the second output data determination signal. Furthermore, the output control portion includes the first latch means for latching the first output control node in the inactive state and the second latch means for latching the second output control node in the inactive state.

With this structure, it becomes possible to output with high speed, from the read data output node, an output signal (DOUT) swinging between the first power source voltage and the first power source reference voltage, based on the first output data determination signal and the second output data determination signal which swing between the second power source voltage and second power source reference voltage.

The first latch means detects that the enable signal makes the power source voltage transition to the first power source reference voltage, and latches the first output control node in the inactive state, and the second latch means detects that the enable signal makes the power source voltage transition to the first power source reference voltage, and latches the second output control node in the inactive state. With this structure, it is avoided that the first and second output control nodes stay in the electrically floating state, thereby erroneous operation due to the noise being prevented.

The output control portion detects the first voltage difference only when the second output control node is in the inactive state, and detects the second voltage difference only when the first output control node is in the inactive state. With this structure, it is prevented that the first and second output control nodes stay in the active state at the same time.

DETAILED DESCRIPTION OF THE PREFERRED EMBODIMENTS

Certain preferred embodiments of the invention will now be described by way of examples and with reference to the accompanying drawings, wherein constituents of the invention having almost like function and structure in each of the several figures are identified by the like reference numeral or character, thereby omitting the redundant and repetitive description, and wherein:

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF PREFERRED EMBODIMENTS

[First Embodiment]

To begin with, there will be described, with reference to FIGS. 1 and 2, an enable signal generation circuit 100 and a data output circuit 200 which are set up in the semiconductor memory device according to the first embodiment of the invention.

Figure 1:
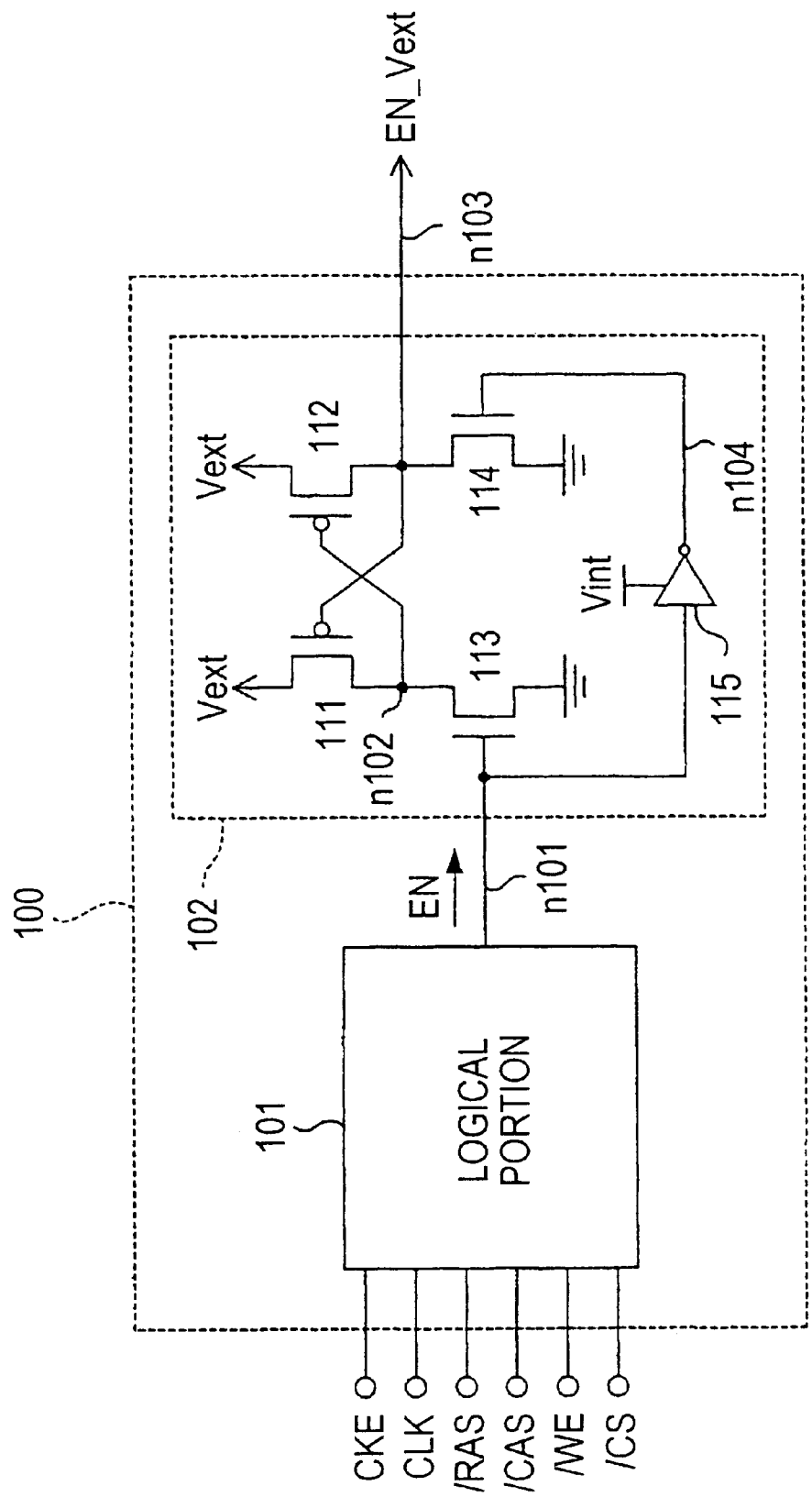
FIG. 1 is a circuit diagram showing the structure of an enable signal generation circuit which is set up in a semiconductor memory device according to the first embodiment of the invention.

Referring to FIG. 1, the enable signal generation circuit 100 includes a logical portion 101 and a level shifter portion 102.

The logical portion 101 changes the logical level of an enable signal EN outputted from a node n101 in response to input signals inputted to the logical portion 101, that is, a clock enable signal CKE, a clock signal CLK, a row address strobe (RAS) signal /RAS, a column address strobe (CAS) signal /CAS, a write enable signal /WE, and a chip selection signal /CS. If the logical level of the enable signal EN is changed from L-level to H-level, the data stored in the semiconductor memory device is taken in the data output circuit 200 as shown in FIG. 2 and is then outputted therefrom to an external circuit. In this case, the minimum voltage of the enable signal EN is the ground voltage GND while the maximum voltage of the same is the internal voltage Vint.

The level shifter portion 102 is made up of p-type MOS transistors (referred to as 'P-transistor' hereinafter) 111 and 112, N-type MOS transistors (referred to as 'N-transistor' hereinafter) 113 and 114, and an inverter 115.

The source of the P-transistor 111 is connected with a supply line of the external voltage Vext, the drain of the same is connected with a node n102, and the gate of the same is connected with a node n103. On one hand, the source of the P-transistor 112 is connected with a supply line of the external voltage Vext, the drain of the same is connected with a node n103, and the gate of the same is connected with a node n102.

The source of the N-transistor 113 is connected with the ground voltage GND line, the drain of the same is connected with a node n102, and the gate of the same is connected with a node n101. On one hand, the source of the N-transistor 114 is connected with the ground voltage GND line, the drain of the same is connected with a node n103, and the gate of the same is connected with a node n104.

The input terminal of an inverter 115 is connected with the node n101 while the output terminal of the same is connected with the node n104. The inverter 115 operates with the internal voltage Vint.

The level shifter portion 102 made up like the above converts the voltage level of the enable signal EN given from the logical portion 101, and then outputs the result of the above conversion as the level shifted enable signal EN_Vext to the node n103. The maximum and minimum voltages of the enable signal EN are the internal voltage Vint and the ground voltage GND, respectively, while the maximum and minimum voltages of the level shifted enable signal EN_Vext are the external voltage Vext and the ground voltage GND, respectively.

Figure 2:
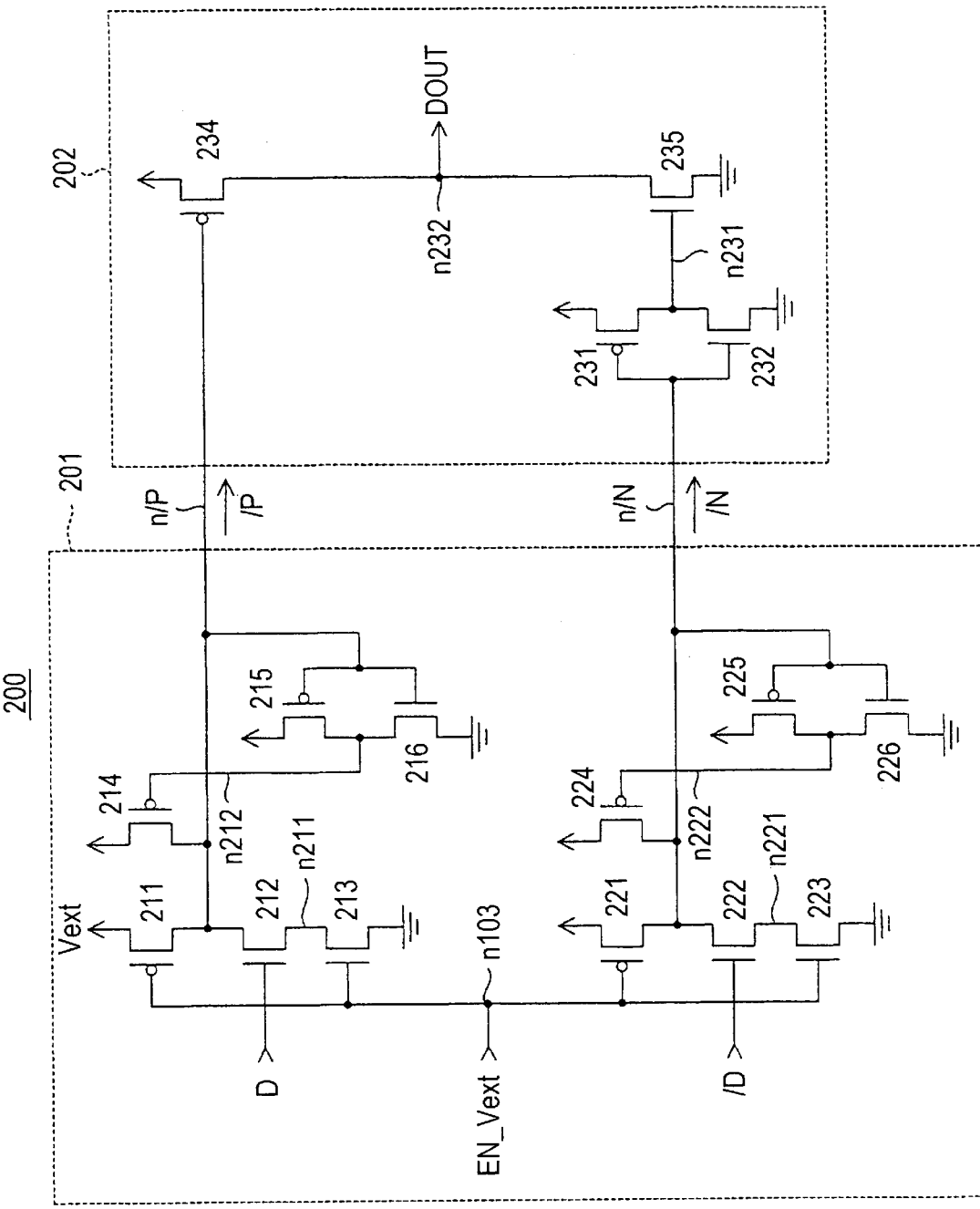
FIG. 2 is a circuit diagram showing the structure of a data output circuit which is set up in a semiconductor memory device according to the first embodiment of the invention.

Referring to FIG. 2, a data output circuit 200 includes an output control signal generation portion 201 and an output portion 202.

The output control signal generation portion 201 is made up to receive the first output data determination signal D and the second output data determination signal /D both of which are outputted from a sense amplifier (not shown) and also to receive the level shifted enable signal EN_Vext outputted from the enable signal generation circuit 100. In this case, the logical levels of the first and second output data determination signals D and /D have the complementary relations therebetween, and their maximum and minimum voltages are equally the internal voltage Vint and the ground voltage GND.

The output control signal generation portion 201 can be divided into the first circuit portion to which the first output data determination signal D is inputted and the second circuit portion to which the second output data determination signal /D is inputted. The first circuit portion is made up of a P-transistor 211, an N-transistor 212, an N-transistor 213, a P-transistor 214, P-transistor 215, and an N-transistor 216. On one hand, the second circuit portion is made up of a P-transistor 221, an N-transistor 222, an N-transistor 223, a P-transistor 224, a P-transistor 225, and an N-transistor 226.

Circuit elements forming the first circuit portion are electrically connected with each other as follows.

The source of the P-transistor 211 is connected with the supply line of the external voltage Vext, the drain of the same with a node n/P, and the gate of the same with the node n103. The source of the N-transistor 212 is connected with the node n211, the drain of the same with the node n/P, and the gate of the same with the transmission line of the first data determination signal D. The source of the N-transistor 213 is connected with the ground voltage GND line, the drain of the same with the node n211, and the gate of the same with the node n103.

The source of the P-transistor 214 is connected with the supply line of the external voltage Vext, the drain of the same with the node n/P, and the gate of the same with the node n212. The source of the P-transistor 215 is connected with the supply line of the external voltage Vext, the drain of the same with the node n212, and the gate of the same with the node n/P. The source of the N-transistor 216 is connected with the ground voltage GND line, the drain of the same with the node n212 and the gate of the same with the node n/P.

Circuit elements forming the second circuit portion are electrically connected with each other as follows.

The source of the P-transistor 221 is connected with the supply line of the external voltage Vext, the drain of the same with a node n/N, and the gate of the same with the node n103. The source of the N-transistor 222 is connected with the node n221, the drain of the same with the n/N, and the gate of the same with the transmission line of the second output determination signal /D. The source of the N-transistor 223 is connected with the ground voltage GND line, the drain of the same with the node n221, and the gate of the same with the node 103.

The source of the P-transistor 224 is connected with the supply line of the external voltage Vext, the drain of the same with the node n/N, and the gate of the same with the node n222. The source of the P-transistor 225 is connected with the supply line of the external voltage Vext, the drain of the same with the node n222, and the gate of the same with the node n/N. The source of the N-transistor 226 is connected with the ground voltage GND line, the drain of the same with the node n222, and the gate of the same with the node n/N.

Next, there will be described about the structure of the output portion 202, which is connected with the output control signal generation portion 201 through the nodes n/P and n/N.

The output portion 202 includes a P-transistor 234, an N-transistor 235, and an inverter made up of a P-transistor 231 and an N-transistor 232. The source of the P-transistor 231 is connected with the supply line of the external voltage Vext, the drain of the same with the node n231, and the gate of the same with the node n/N. The source of the N-transistor 232 is connected with the ground voltage GND line, the drain of the same with the node n231, and the gate of the same with the node n/N. The source of the P-transistor 234 is connected with the supply line of the external voltage Vext, the drain of the same with the node n232, and the gate of the same with the node n/P. The source of the N-transistor 235 is connected with the ground voltage GND line, the drain of the same with the node n232, and the gate of the same with the node n231.

Figure 3:
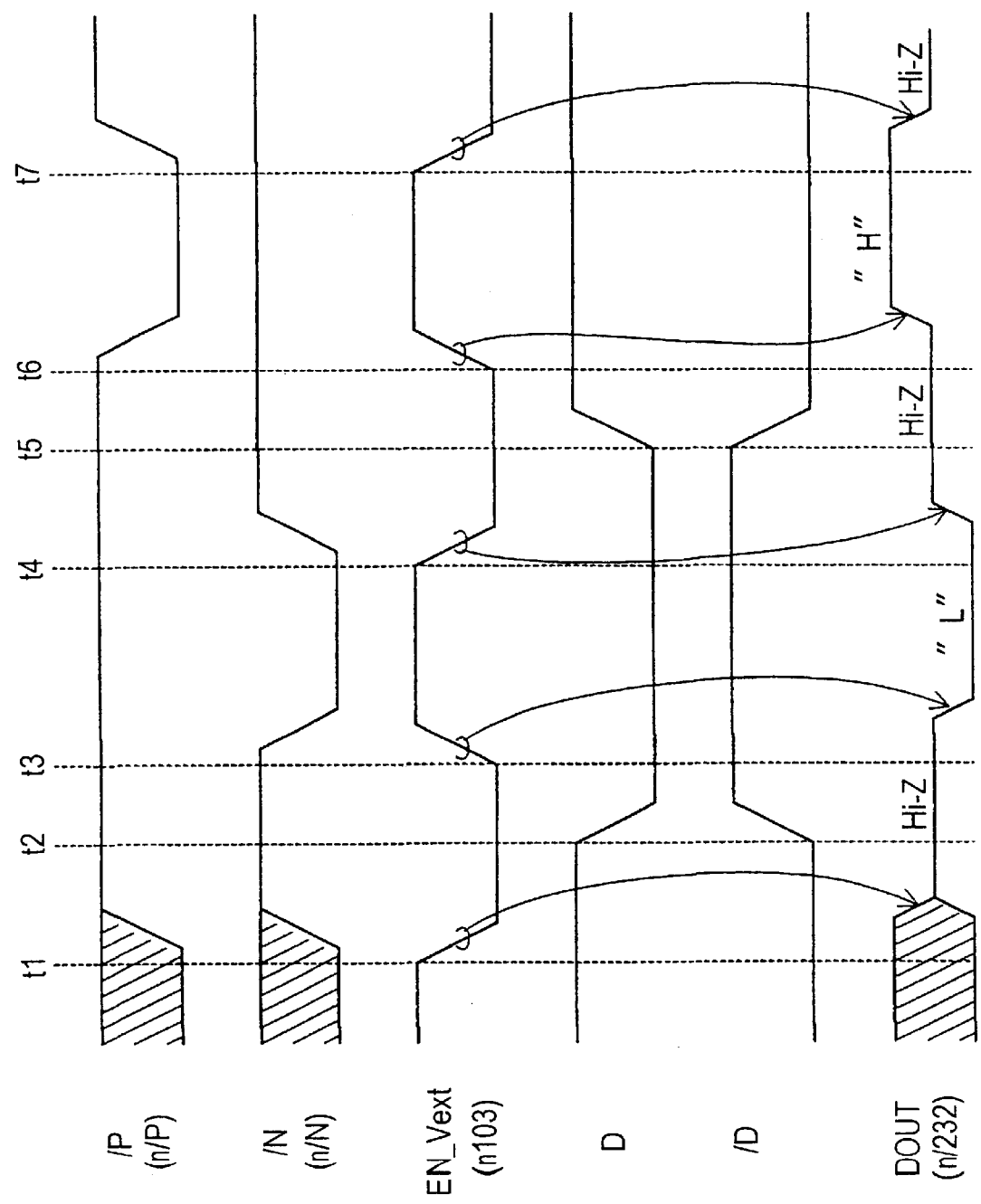
FIG. 3 is a timing chart of the read operation by the semiconductor memory device according to the first and second embodiments of the invention.

With reference to FIG. 3, there will be now described the operation of the semiconductor memory device according to the first embodiment of the invention, the semiconductor memory device being provided with the enable signal generation circuit 100 and the data output circuit 200.

<At Time t1>

When the level shift enable signal EN_Vext outputted from the enable signal generation circuit 100 makes the logical level transition of H-to-L, both of the P-transistors 211 and 221 belonging to the output control signal generation portion 201 are equally turned on while both of the N-transistors 213 and 223 are equally turned off. With this, the nodes n/P and n/N are charged to be the external voltage Vext and are supplied to the output portion 202 from the output control signal generation portion 201 through the nodes n/P and n/N, respectively. Therefore, the first output control signal /P and the second output control signal /N become equally H-level.

When the first output control signal /P becomes H-level, the P-transistor 234 belonging to the output portion 202 stays in the OFF state. Also, when the second output control signal /N becomes H-level, the node n231 becomes L-level according to the operation of the P-transistor 231 and N-transistor 232 belonging to the output portion 202. Thus, the N-transistor 235 stays in the OFF state. As a result, the node n232 stays in a high impedance (referred to as 'Hi-Z' hereinafter) state.

Furthermore, at this time, the node n212 belonging to the output control signal generation portion 201 is made to be L-level by the P-transistor 215 and N-transistor 216 while the node n222 also belonging to the output control signal generation portion 201 is made to be L-level by the P-transistor 225 and N-transistor 226. Therefore, both of the P-transistors 214 and 224 equally stay in the ON state and the nodes n/P and n/N are latched at H-level. In this way, the P-transistors 214, 215 and N-transistor 216 form the first feedback circuit with respect to the node n/P. On one hand, the P-transistors 224, 225 and N-transistor 226 form the second feedback circuit with regard to the node n/N.

<At Time t2>

Even though there is changed the logical level of the first output data determination signal D or the second output data determination signal /D, the nodes n/P and n/N are respectively latched by the first feedback circuit and the second feedback circuit, so that the node n232 belonging to the output portion 202 holds the Hi-Z state.

<At Time t3>

If the level shift enable signal EN_Vext makes the logical level transition of L-to-H, the P-transistors 211 and 221 are equally turned off while the N-transistors 213 and 223 are equally turned on.

At this time, as the first output data determination signal D is at L-level, the N-transistor 212 stays in the OFF state and the node n/P is held at H-level by the first feedback circuit. Accordingly, the P-transistor 234 holds the OFF state. On one hand, as the second output data determination signal /D is at H-level, the N-transistor 222 is in the ON state and the node n/N makes the logical level transition of H-to-L. Accordingly, the N-transistor 235 is turned on. As the result of this, the node n232 makes the logical level transition of Hi-Z state-to-L. In this way, the output signal DOUT of L-level is outputted from the node n232 toward an external circuit.

<At Time t4>

Again, if the level shift enable signal EN_Vext makes the logical level transition of H-to-L, the P-transistors 211 and 221 belonging to the output control signal generation portion 201 are equally turned on while the N-transistors 213 and 223 are equally turned off. With this, the nodes n/P and n/N equally stay in the H-level state and the node n232 makes the logical level transition of L-to-Hi-Z state. At this time, the nodes n/P and n/N are equally latched at H-level by the first and second feedback circuits, respectively.

<At Time t5>

As described above, even if the logical level of the first output data determination signal D or that of the second output data determination signal /D is changed, the node n/P and the node n/N are latched at H-level by the first feedback circuit and the second feedback circuit. Therefore, the node n232 belonging to the output portion 202 is able to hold the Hi-Z state.

<At Time t6>

If the logical level of the level shift enable signal EN_Vext is changed from L-level to H-level, the P-transistors 211 and 221 belonging to the output control signal generation portion 201 are equally turned off while the N-transistors 213 and 223 belonging to the same are equally turned on.

At this time, as the first output data determination signal D is at H-level, the N-transistor 212 is in the ON state and the node n/P makes the logical level transition of H-to-L. Accordingly, the P-transistor 234 is turned on. On one hand, as the second output data determination signal /D is at L-level, the N-transistor 222 is in the OFF state and the node n/N is held at H-level by means of the second feedback circuit. Accordingly, the N-transistor 235 holds the OFF state. As the result of this, the node n232 makes the logical level transition of Hi-Z state-to-H and an output signal DOUT of H-level is outputted from the node n232 to an external circuit.

<At Time t7>

Again, if the logical level of the level shift enable signal EN_Vext makes the logical level transition of H-to-L, the P-transistors 211 and 221 belonging to the output control signal generation portion 201 are equally turned on while the N-transistors 213 and 223 belonging to the same are equally turned off. With this, the nodes n/P and n/N become equally H-level while the node n232 makes the logical level transition of H-to-Hi-Z state. Furthermore, at this time, the nodes n/P and n/N are latched at H-level by the first feedback circuit and the second feedback circuit, respectively.

As described above, according to the semiconductor memory device by the first embodiment of the invention, which is provided with the enable signal generation circuit 100 and the data output circuit 200, it becomes possible to generate the output signal DOUT swinging between the external voltage Vext and the ground voltage GND, based on the first output data determination signal D and the second output data determination /D, both of which swing between the internal voltage Vint and the ground voltage GND. Moreover, it becomes necessary neither to provide any level shifter for shifting the voltage level of the first output data determination signal D nor to provide any level shifter for shifting the voltage level of the second output data determination signal /D.

The enable signal generation circuit 100 is provided with the level shifter portion 102 in order to generate the level shift enable signal EN_Vext swinging between the external voltage Vext and the ground voltage GND, based on the enable signal EN swinging between the internal voltage Vint and the ground voltage GND. However, the level shift enable signal EN_Vext can be commonly supplied not only to the data output circuit 200 but also to a plurality of data output circuits (not shown) having the almost same structure as the data output circuit 200. For instance, in case of increasing the number of data output circuits for widening the bit width of the output data, it is unnecessary to add any other circuit identical to the enable signal generation circuit 100. Thus, according to the semiconductor memory device by the first embodiment of the invention, as the enable signal generation circuit 100 is provided with the level shifter portion 102, the number of the circuit elements is certainly increased. However, this increase in the number of circuit elements can be sufficiently absorbed because the level shifter can be eliminated from a plurality of data output circuits. Therefore, the circuit scale of the semiconductor memory device can be reduced as a whole.

Furthermore, the level shift enable signal EN_Vext controls the ON/OFF operation of the P-transistor 211, N-transistor 213, P-transistor 221, and N-transistor 223, all of which belong to the output control signal generation portion 201. When this level shift enable signal EN_Vext is at H-level, it gives the external voltage Vext to the gate of each transistor, so that P-transistors 211 and 221 stay in the complete OFF state. Consequently, even if the P-transistor 211 stays in the incomplete OFF state, there is prevented the generation of a so-called penetration current which flows from the power source to the ground via the P-transistor 211, N-transistors 212 and 213. Similarly, even if the P-transistor 221 stays in incomplete OFF state, there is prevented the generation of such penetration current which flows from the power source to the ground via the P-transistor 221, N-transistors 222 and 223.

Furthermore, the output signal control generation portion 201 is provided with the first feedback circuit for latching the node n/P at H-level and the second feedback circuit for latching the node n/N at H-level. The first feedback circuit is made up of the P-transistor 214, 215, and N-transistor 216. On one hand, the second feedback circuit is made up of the P-transistors 224, 225, and N-transistor 226. These first feedback circuit and the second feedback circuit produce the following effects.

If there is provided neither the first feedback circuit nor the second feedback circuit and when the level shift enable signal EN_Vext is at H-level, the first output data determination signal D is at H-level, and the second output data determination signal /D is at L-level, the node n/P is fixed to L-level, thereby the node n/N staying in the electrically floating state. In the stationary state, the P-transistor 234 belonging to the output portion 202 is turned on while the N-transistor 235 is turned off. However, if the potential of the node n/N is dropped up to the L-level due to the noise or the like, the N-transistor 235 is turn on, as the result of which there is generated a large penetration current flowing from the power source to the ground via the P-transistor 234 and the N-transistor 235.

With regard to this point, according to the semiconductor memory device of the first embodiment, the node n/P is latched at H-level by the first feedback circuit except the period of time in which the N-transistors 212 and 213 are turned on. Similarly, the node n/N is latched at H-level by the second feedback circuit except the period of time in which the N-transistors 222 and 223 are turned on. Consequently, the P-transistor 234 and N-transistor 235 can not be turned on at the same time, so that there is prevented the generation of the penetration current passing through the P-transistor 234 and N-transistor 235.

[Second Embodiment]

A semiconductor memory device according to the second embodiment of the invention can be formed by replacing the data output circuit 200 of the semiconductor memory device according to the first embodiment of the invention by a data output circuit 300.

Figure 4:
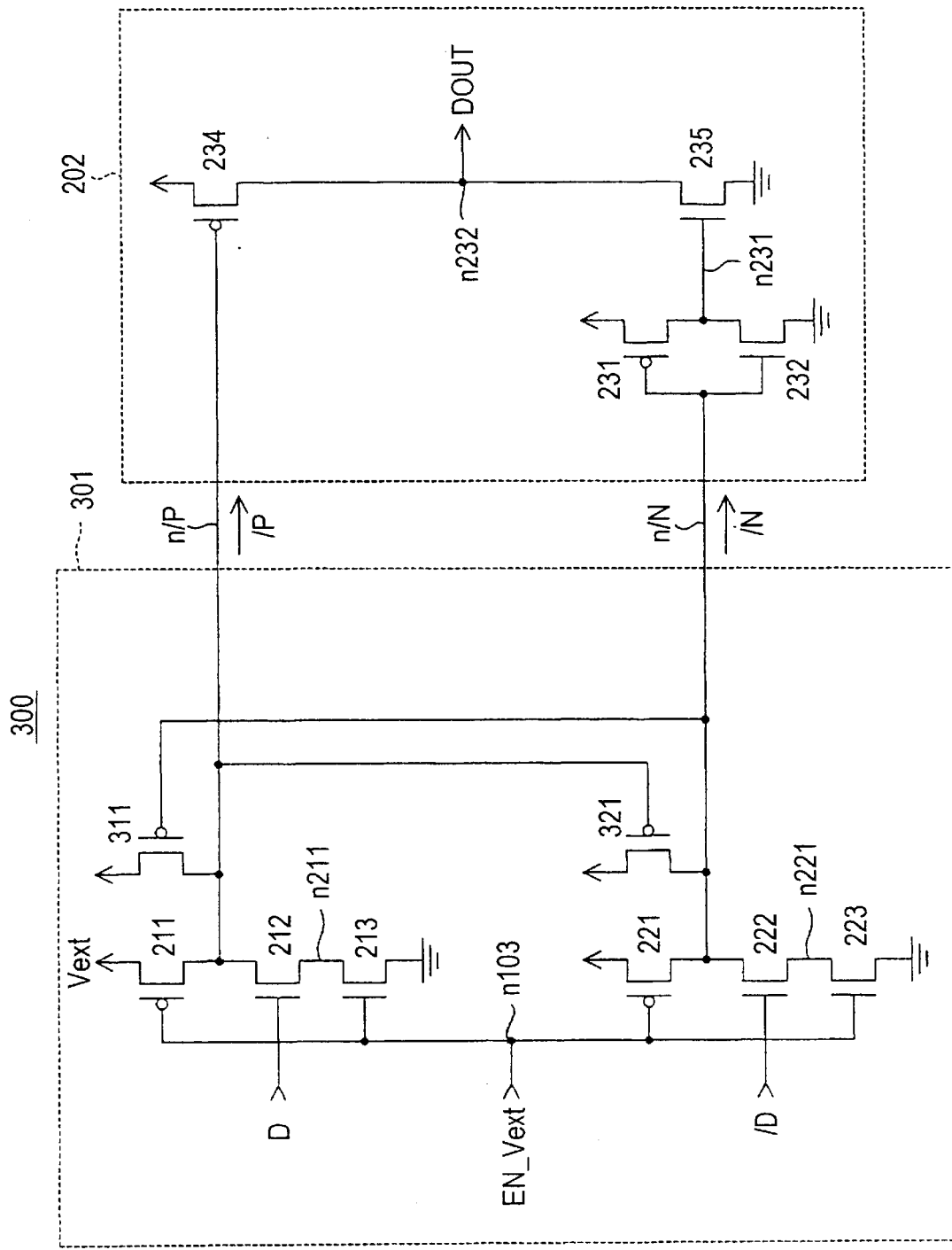
FIG. 4 is a circuit diagram showing the structure of a data output circuit which is set up in a semiconductor memory device according to the second embodiment of the invention.

As shown in FIG. 4, the data output circuit 300 is made up of an output control signal generation portion 301 and an output portion 202. This output circuit 202 is identical to that which is adopted in the semiconductor memory device according to the first embodiment of the invention.

The output control signal generation portion 301 receives the first output data determination signal D and the second output data determination signal /D both of which are outputted from a sense amplifier (not shown), and also receives the level shift enable signal EN_Vext outputted from the enable signal generation circuit 100.

The output control signal generation portion 301 is divided into two circuit portions, that is, the first circuit portion to which the first output data determination signal D is inputted and the second circuit portion to which the second output data determination signal /D is inputted. The first circuit portion is made up of a P-transistor 211, N-transistors 212, 213, and a P-transistor 311. The second circuit portion is made up of a P-transistor 221, N-transistors 222, 223, and a P-transistor 321.

Circuit elements forming the first circuit portion are electrically connected with each other as follows.

The source of the P-transistor 211 is connected with the supply line of the external voltage Vext, the drain of the same with a node n/P and the gate of the same with a node n103.

The source of the N-transistor 212 is connected with a node n211, the drain of the same with the node n/P and the gate of the same with the transmission line of the first output data determination signal D. The source of the N-transistor 213 is connected with the ground voltage GND line, the drain of the same with the node n211 and the gate of the same with the node n103.

The source of the P-transistor 311 is connected with the supply line of the external voltage Vext, the drain of the same with the node n/P, and the gate of the same with the node n/N.

Circuit elements forming the second circuit portion are electrically connected with each other as follows.

The source of the P-transistor 221 is connected with the supply line of the external voltage Vext, the drain of the same with a node n/N and the gate of the same with the node n103.

The source of the N-transistor 222 is connected with the node n221, the drain of the same with the node n/N, and the gate of the same with the transmission line of the second output data determination signal /D. The source of the N-transistor 223 is connected with the ground voltage GND line, the drain of the same with the node n221, and the gate of the same with the node n103.

The source of the P-transistor 321 is connected with the supply line of the external voltage Vext, the drain of the same with the node n/N, and the gate of the same with the node n/P.

Difference between this output control signal generation portion 301 and the output control signal generation portion 201 of the semiconductor memory device according to the first embodiment, exists in the structure of the feedback circuit for use in latching the nodes n/P and n/N at H-level.

As shown in FIG. 2, in the output control signal generation portion 201, the first feedback circuit is made up of the P-transistors 214, 215, and the N-transistor 216, while the second feedback circuit is made up of the P-transistors 224, 225, and the N-transistor 226. On one hand, as shown in FIG. 4, the feedback circuit of the output control signal generation portion 301 is formed as a circuit of the flip-flop type made up of P-transistors 311 and 321.

In the next, there will be described the operation of the semiconductor memory device according to the second embodiment having the enable signal generation circuit 100 and the data output circuit 300 with reference to FIG. 3.

If the level shift enable signal EN_Vext makes the logical level transition of H-to-L, similar to the case of the semiconductor memory device according to the first embodiment, the P-transistors 211 and 221 belonging to the output control signal generation portion 301 stay in the ON state while the N-transistors 213 and 223 belonging to the same stay in the OFF state. Therefore, both of the nodes n/P and n/N equally becomes H-level regardless of the logical levels of the first output data determination signal D and the second output data determination signal /D (at time t1, time t4, and time t7). At this time, the P-transistors 311 and 321 stay in the OFF state (in other words, the feedback circuit stays in the disable state).

After time t1, if the first output data determination signal D makes the logical level transition to L-level, the second output data determination signal /D does the same to H-level (time t2), and further, the level shift enable signal EN__Vext does the same to H-level from L-level (time t3), the potential of the nodes n/P and n/N changes as follows.

As the P-transistor 221 stays in the OFF state while the N-transistors 222 and 223 stay in the ON state, the node n/N makes the logical level transition to L-level.

On one hand, the N-transistor 213 stays in the ON state, but the P-transistor 211 and the N-transistor 212 stay in the OFF state, so that the external voltage Vext or the ground voltage GND can not be applied to the node n/P through these P-transistor 211, N-transistors 212 and 213. At this time, however, the node n/N is L-level, so that the P-transistor 311 stays in the ON state and the external voltage Vext is applied to the node n/P through the P-transistor 311, thereby the node n/P is latched at H-level.

At this point of time, the logical level of the first output control signal /P supplied to the output portion 202 through the node n/P is H-level while the logical level of the second output control signal /N supplied to the output portion 202 through the node n/N is L-level. Accordingly, the output portion 202 can output an output signal OUT of L-level to an external circuit through the node n232.

After the time t4, the first output data determination signal D makes the logical level transition of L-to-H while the second output data determination signal /D does the same of H-to-L (time t5), and then, if the level shift enable signal EN__Vext makes the logical level transition of L-to-H (time t6), the each potential of nodes n/P and n/N changes as follows.

As the P-transistor 211 stays in the OFF state while the N-transistors 212 and 213 stay in the ON state, the node n/P makes logical level transition of H-to-L.

On one hand, the N-transistor 223 stays in the ON state, but the P-transistor 221 and the N-transistor 222 stay in the OFF state, so that the external voltage Vext or the ground voltage GND can not be applied to the node n/N through these P-transistor 221, N-transistors 222 and 223. At this time, however, the node n/P is L-level, so that the P-transistor 321 stays in the ON state and the external voltage Vext is applied to the node n/N through the P-transistor 321, thereby the node n/N is latched at H-level.

At this point of time, the logical level of the first output control signal /P supplied to the output portion 202 through the node n/P is L-level while the logical level of the second output control signal /N supplied to the output portion 202 through the node n/N is H-level. Accordingly, the output portion 202 can output an output signal OUT of H-level to an external circuit through the node n232.

As described above, according to the semiconductor memory device by the second embodiment of the invention, which is provided with the enable signal generation circuit 100 and the data output circuit 300, similar to the semiconductor memory device according to the first embodiment of the invention, it becomes possible to generate the output signal DOUT swinging between the external voltage Vext and the ground voltage GND, based on the first output data determination signal D and the second output data determination /D, both of which swings between the internal voltage Vint and the ground voltage GND. Moreover, it becomes necessary neither to provide any level shifter for shifting the voltage level of the first output data determination signal D nor to provide any level shifter for shifting the voltage level of the second output data determination signal /D. Moreover, the output control signal generation portion 301 of the semiconductor memory device according to the second embodiment of the invention can be constructed by using less circuit elements comparing with the output control signal generation potion 201 according to the first embodiment of the invention.

Now, as described in the above in connection with the semiconductor memory device according to the first embodiment of the invention, in order to prevent the penetration current from being generated, it has to be avoided that both of the P-transistor 234 and N-transistor 235 belonging to the output portion 202 stay in the ON state at the same time.

In this regard, according to the semiconductor memory device according to the second embodiment, it is arranged such that when either the node n/P or the node n/N becomes L-level, the opposite node is latched at H-level by means of the feedback circuit. To put it concretely, if the node n/P becomes L-level and the P-transistor 234 belonging to the output portion 202 stays in the ON state, the node n/N is latched at H-level by the P-transistor 321 in the ON state, so that the N-transistor 235 belonging to the output portion 202 stays in the OFF state. Similarly, if the node n/N becomes L-level and the N-transistor 235 belonging to the output portion 202 stays in the ON state, the node n/P is latched at H-level by the P-transistor 311 in the ON state, so that the P-transistor 234 belonging to the output portion 202 stays in the OFF state. In this way, the P-transistor 234 and N-transistor 235 can not stay in the ON state at the same time. Therefore, it becomes possible to prevent the penetration current flowing from the power source to the ground through these P-transistor 234 and N-transistor 235.

Furthermore, in order to realize the power reduction in the semiconductor memory device, it is needed to prevent the generation of the penetration current not only in the output portion 202 but in the output control signal generation portion 301.

In the output control signal generation portion 301, the P-transistor 211 and N-transistor 213 are commonly controlled by the level shift enable signal EN__Vext, so that there is no chance for these transistors to be turned on at the same time. Accordingly, even if the N-transistor 212 is in the ON state, there is no generation of the penetration current passing through the P-transistor 211 and N-transistor 213. Similarly, the P-transistor 221 and N-transistor 223 are commonly controlled by the level shift enable signal EN__Vext, so that there is no chance for these transistors to be turned on at the same time. Accordingly, even if the N-transistor 222 is in the ON state, there is no generation of the penetration current passing through the P-transistor 221 and N-transistor 223.

In the next, let us discuss the current path from the P-transistor 311 to N-transistors 212 and 213 as well as the current path from the P-transistor 321 to N-transistors 222 and 223.

The P-transistor 311 stays in the ON state when the node n/N is at L-level, in other words, when the second output data determination signal /D is at H-level. At this time, the first data determination signal D never fails to be at L-level, so that the N-transistor 212 is in the OFF state. Thus, the P-transistor 311 and N-transistor 212 can not be turned on at the same time. As the result of this, there is no generation of the penetration current passing through the P-transistor 311 and N-transistors 212, 213.

Similarly, the P-transistor 321 stays in the ON state when the node n/P is at L-level, in other words, when the first output data determination signal D is at H-level. At this time, the second data determination signal /D never fails to be at L-level, so that the N-transistor 222 is in the OFF state. Thus, the P-transistor 321 and N-transistor 222 can not be turned on at the same time. As the result of this, there is no generation of the penetration current passing through the P-transistor 321 and N-transistors 222, 223.

As has been discussed in the above so far, according to the semiconductor memory device by the second embodiment of the invention, generation of the penetration current can be prevented not only in the output portion 202 but in the output control signal generation portion 301. The reduction of the power consumption in the semiconductor memory device can be more effectively realized.

[Third Embodiment]

The semiconductor memory device according to the third embodiment of the invention can be obtained by substituting a data output circuit 400 for the data output circuit 200 of the semiconductor memory device according to the first embodiment.

Figure 5:
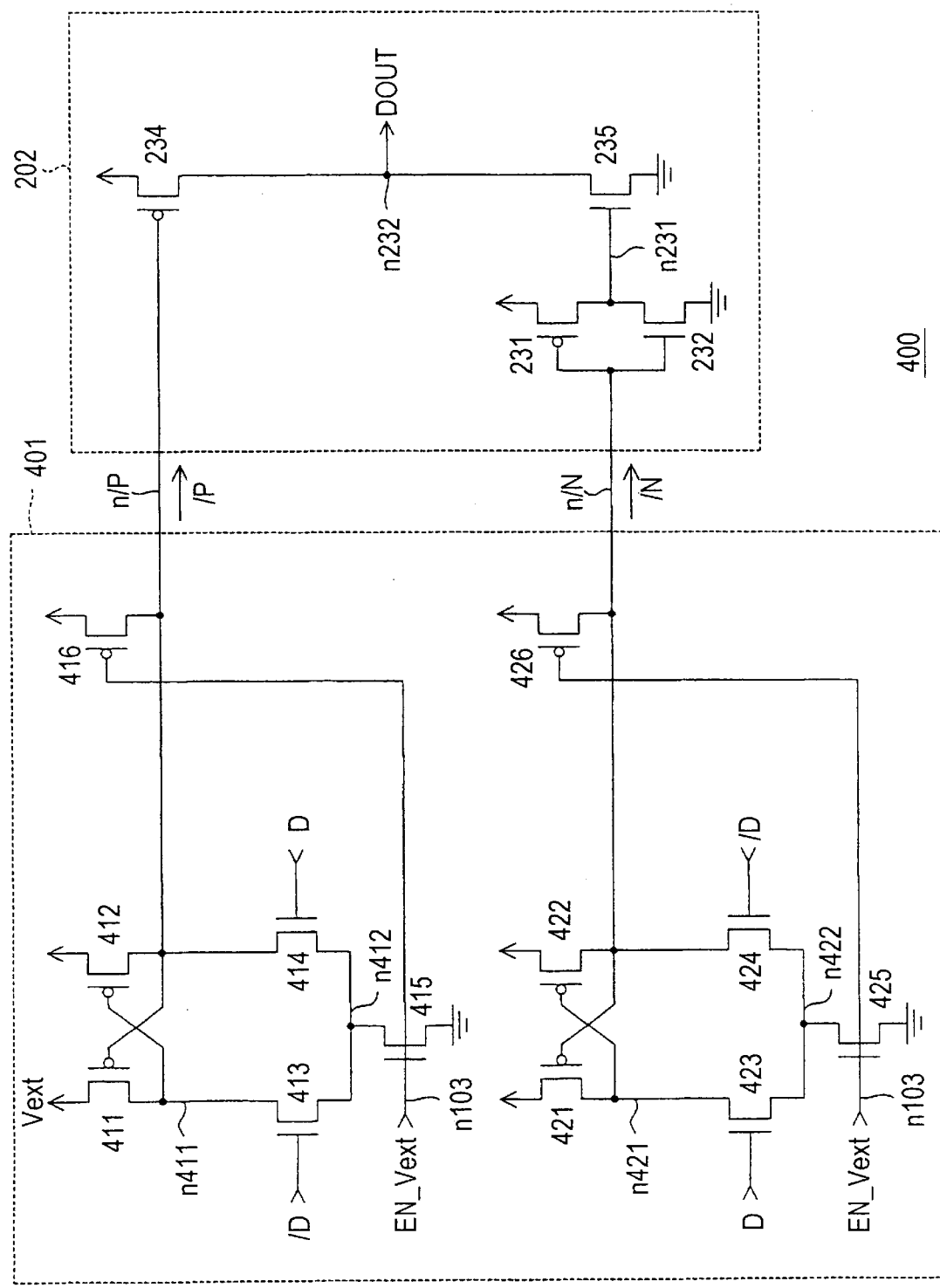
FIG. 5 is a circuit diagram showing the structure of a data output circuit which is set up in a semiconductor memory device according to the third embodiment of the invention.

As shown in FIG. 5, the data output circuit 400 is provided with an output control signal generation potion 401 and an output circuit 202. This output portion 202 is identical to that which is adopted by the semiconductor memory device according to the first and second embodiments of the invention as described above.

The output control signal generation portion 401 receives the first output data determination signal D and the second output data determination signal /D both of which are outputted from a sense amplifier (not shown), and also receives a level shift enable signal EN_Vext outputted from the enable signal generation circuit 100.

The output control signal generation portion 401 includes the first circuit portion which forms the first output control signal /P based on the first output data determination signal D, the second output data determination signal /D, and the level shift enable signal EN_Vext, and outputs the first output control signal /P to the node n/P; and the second circuit portion which forms the second output control signal /N and outputs this signal /N to the node n/N. The first circuit portion is composed of P-transistors 411, 412, N-transistors 413, 414, 415, and a P-transistor 416, while the second circuit portion is composed of P-transistors 421, 422, N-transistors 423, 424, 425, and a P-transistor 426.

Circuit elements forming the first circuit portion are electrically connected with each other as follows.

The source of the P-transistor 411 is connected with the supply line of the external voltage Vext, the drain of the same with the node n411, and the gate of the same with the node n/P. The source of the P-transistor 412 is connected with the supply line of the external voltage Vext, the drain of the same with the node n/P and the gate of the same with the node n411.

The source of the N-transistor 413 is connected with the node n412, the drain of the same with the node n411, and the gate of the same with the transmission line of the second output data determination signal /D. The source of the N-transistor 414 is connected with the node n412, the drain of the same with the node n/P, and the gate of the same with the transmission line of the first output data determination signal D. The source of the N-transistor 415 is connected with the ground voltage GND line, the drain of the same with the node n412, and the gate of the same with the node n103.

The source of the P-transistor 416 is connected with the supply line of the external voltage Vext, the drain of the same with the node n/P, and the gate of the same with the node n103.

Circuit elements forming the second circuit portion are electrically connected with each other as follows.

The source of the P-transistor 421 is connected with the supply line of the external voltage Vext, the drain of the same with the node n421, and the gate of the same with the node n/N. The source of the P-transistor 422 is connected with the supply line of the external voltage Vext, the drain of the same with the node n/N, and the gate of the same with the node n421.

The source of the N-transistor 423 is connected with the node n422, the drain of the same with the node n421, and the gate of the same with the transmission line of the first output data determination signal D. The source of the N-transistor 424 is connected with the node n422, the drain of the same with the node n/N, and the gate of the same with the transmission line of the second output data determination signal /D. The source of the N-transistor 425 is connected with the ground voltage GND line, the drain of the same with the node n422, and the gate of the same with the node n103.

The source of the P-transistor 426 is connected with the supply line of the external voltage Vext, the drain of the same with the node n/N, and the gate of the same with the node n103.

As describe above, both of the first and second circuit portions constituting the output control signal generation portion 401 are provided with an N-transistor input type differential amplification circuit, which becomes active when the level shift enable signal EN_Vext is at H-level. The first circuit portion sets the logical level of the node n/P to be at H-level or L-level in response to the logical level of the first output data determination signal D or the second output data determination signal /D. On one hand, the second circuit portion sets the logical level of the node n/N to be at H-level or L-level in response to the logical level of the first output data determination signal D or the second output data determination signal /D.

Furthermore, when the level shift enable signal EN_Vext is at L-level, the differential amplification circuit belonging to the first and second circuit portions becomes inactive, and the node n/P and the node n/N are set to be at H-level by the P-transistor 416 and P-transistor 426, respectively. With this, the node n232 belonging to the output portion 202 stays in the Hi-Z state.

Figure 6:
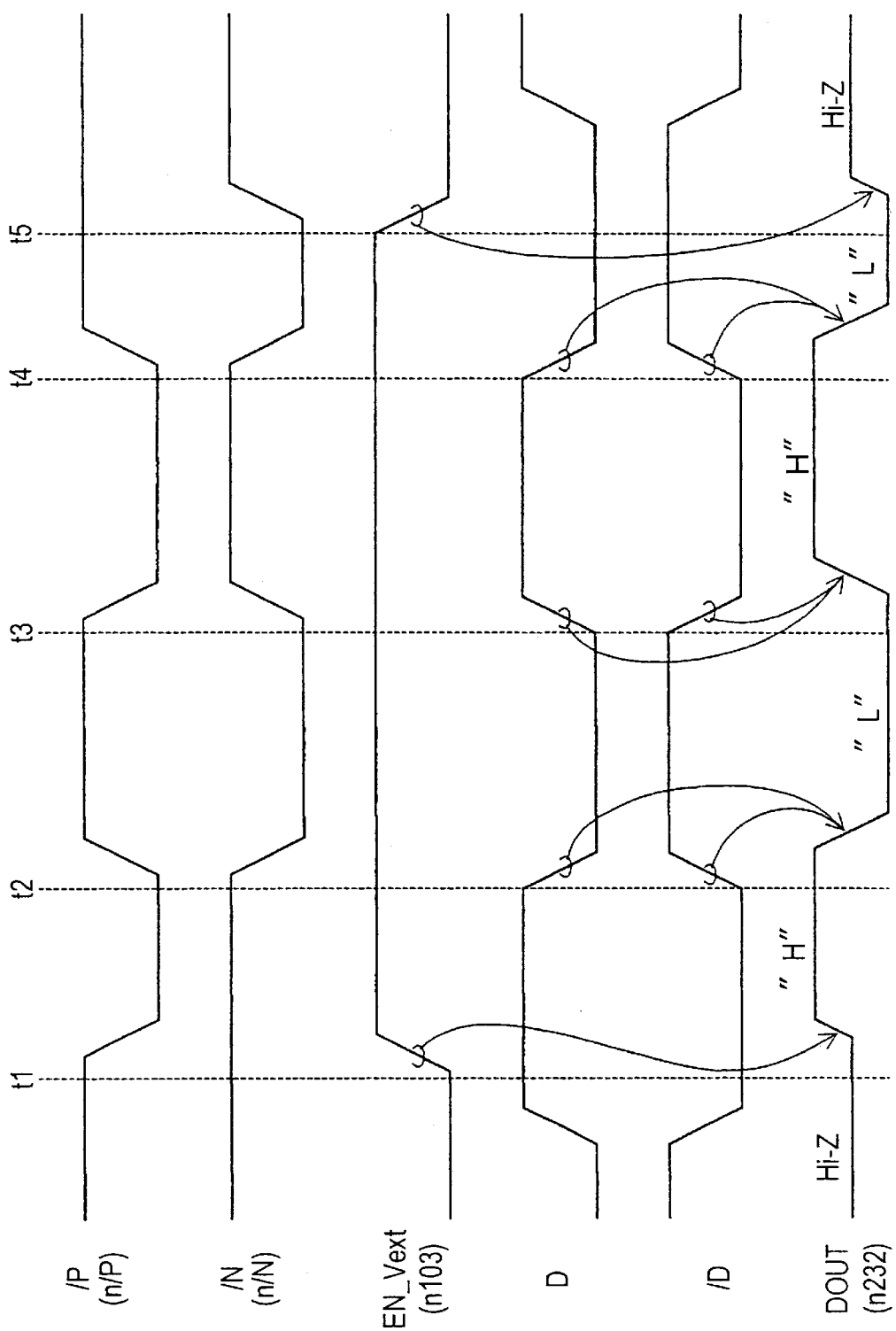
FIG. 6 is a timing chart of the read operation by the semiconductor memory device according to the third and fourth embodiments of the invention.

In the next, the operation of the semiconductor memory device having the enable signal generation circuit 100 and the data output circuit 400 according to the third embodiment will be described with reference to FIG. 6.

The different point between the semiconductor memory device according to the third embodiment and those according to the first and second embodiments is that no negation of level shift enable signal EN_Vext takes place for every output of the output signal DOUT (i.e. every read of stored data). While the data is continuously read out, the level shift enable signal EN_Vext is held in the asserted state (i.e. at H-level), and the logical level of the output signal DOUT changes according to the logical level change of the first output data determination signal D and the second output data determination signal /D. The logical level of this output signal DOUT is the data read out from the semiconductor memory device according to the third embodiment of the invention.

<Before Time 1 and After Time t5>

When the level shift enable signal EN_Vext is at L-level, the N-transistors 415 and 425 belonging to the output control signal generation portion 401 are turned off, while the P-transistors 416 and 426 belonging to the same are turned on. Because of this, both of nodes n/P and n/N are equally fixed at H-level, while both of the P-transistor 234 and N-transistor 235 belonging to the output portion 202 are equally turned off, thereby the node n232 staying in the Hi-Z state.

<At Time t1>

As the first output data determination signal D is at H-level and the second output data determination signal /D is at L-level, the N-transistor 413 belonging to the first circuit portion of the output control signal generation portion 401 stays in the OFF state while the N-transistor 414 belonging to the same stays in the ON state. On one hand, the N-transistor 423 belonging to the second circuit portion of the output control signal generation portion 401 stays in the ON state while the N-transistor 424 belonging to the same stays in the OFF state.

At this place, on the side of the first circuit portion, if the level shift enable signal EN_Vext makes the logical level transition of L-to-H, the N-transistor 415 is turned on and the P-transistor 416 is turned off, thereby the node n/P making the logical level transition of H-to-L. When the node n/P is at L-level, the P-transistor 411 stays in the ON state and the node 411 makes the logical level transition to H-level, thus the P-transistor 412 staying in OFF state. Consequently, the node n/P is fixed at L-level while the node n411 is fixed at H-level.

On one hand, on the side of the second circuit portion, the N-transistor 425 is turned on and the P-transistor 426 is turned off. With this, the node n421 makes the logical level transition to L-level. When the node n421 is at L-level, the P-transistor 422 stays in the ON state, so that the node n/N holds the H-level state and the P-transistor 421 holds the OFF state.

As the node n/P is at L-level and the node n/N is at H-level, the P-transistor 234 belonging to the output portion 202 is turned on and the N-transistor 235 is turned off. As a result, the output signal DOUT of H-level is outputted from the node n232.

<At Time t2>

If the first output data determination signal D makes the logical level transition of H-to-L and the second output data determination signal /D makes the logical level transition of L-to-H, the N-transistor 413 on the side of the first circuit portion of the output control signal generation portion 401 is turned on, and the N-transistor 414 on the same side is turned off. And also, the node n411 makes the logical level transition of H-to-L and the P-transistor 412 is turned on. With this, the node n/P makes the logical level transition of L-to-H and the P-transistor 411 is turned off.

On one hand, on the side of the second circuit portion, the N-transistor 423 is turned off and the N-transistor 424 is turned on, so that the node n/N makes the logical level transition of H-to-L. When the node n/N makes the logical level transition of H-to-L, the P-transistor 421 is turned on, the node n421 makes the logical level transition of L-to-H and the P-transistor 422 is turned off.

As the node n/P is at H-level and the node n/N is at L-level, the P-transistor 234 belonging to the output portion 202 is turned off and the N-transistor 235 is turned on. As a result, the output signal DOUT of L-level is outputted from the node 232.

<At Time t3>

If the first output data determination signal D makes the logical level transition of L-to-H and the second output data determination /D makes the logical level transition of H-to-L, the output control signal generation portion 401 and the output portion 202 execute the same operation as that at time t1. As a result, the output signal DOUT of H-level is outputted from the node n232.

<At time t4>

Again, if the first output data determination signal D makes the logical level transition of H-to-L and the second output data determination /D makes the logical level transition of L-to-H, the output control signal generation portion 401 and the output portion 202 execute the same operation as that at time t2. As a result, the output signal DOUT of L-level is outputted from the node n232.

<At Time t5>

If the level shift enable signal EN_Vext makes the logical level transition of H-to-L, the N-transistor 415 on the side of the first circuit portion is turned off and the P-transistor 416 is turned on, thereby the node n/P being fixed at H-level. Similarly, on the side of the second circuit portion, the N-transistor 425 is turned off and the P-transistor 426 is turned on, thereby the node n/N being fixed at H-level. As nodes n/P and n/N are equally at H-level, the P-transistor 234 and N-transistor 235 belonging to the output portion 202 are equally turned off and the node n232 stays in the Hi-Z state.

As described above, according to the semiconductor memory device by the third embodiment of the invention, which is provided with the enable signal generation circuit 100 and the data output circuit 400, similar to the semiconductor memory device according to the first and second embodiments of the invention, it becomes possible to generate the output signal DOUT swinging between the external voltage Vext and the ground voltage GND based on the first output data determination signal D and the second output data determination /D, both of which swing between the internal voltage Vint and the ground voltage GND.

Moreover, transistors taking part in the H-to-L logical level transition of the node n/P and the H-to-L logical level transition of the node n/N are N-transistors 414, 415 and N-transistors 424, 425. In other words, the logical level transition of H-to-L of the nodes n/P and n/N is executed by means of two transistors arranged in two steps, so that the logical level transition can be executed in a very short time, thus realizing the high speed data read.

As described above, the maximum voltage of the first and second output data determination signals D and /D is the internal voltage Vint while the minimum voltage of the same is the ground voltage GND, and these first and second output data determination signals D and /D are received by two differential amplification circuits provided in the output control signal generation portion 401. Accordingly, with the structure like this, even if the voltage level of the first output data determination signal D and second output data determination signal /D fail to reach the internal voltage Vint or the ground voltage GND, the nodes n/P and n/N can be set to be at H-level or at L-level by each differential amplification circuit as long as there is a predetermined potential difference ÄV between the first and second output data determination signals D and /D. Like this, the logical level of the nodes n/P and n/N can be determined before the first and second output data determination signals D and /D take the maximum voltage or the minimum voltage, so that it becomes possible to read the data in a very short time.

[Fourth Embodiment]

The semiconductor memory device according to the fourth embodiment of the invention can be obtained by substituting a data output circuit 500 for the data output circuit 400 of the semiconductor memory device according to the third embodiment.

Figure 7:
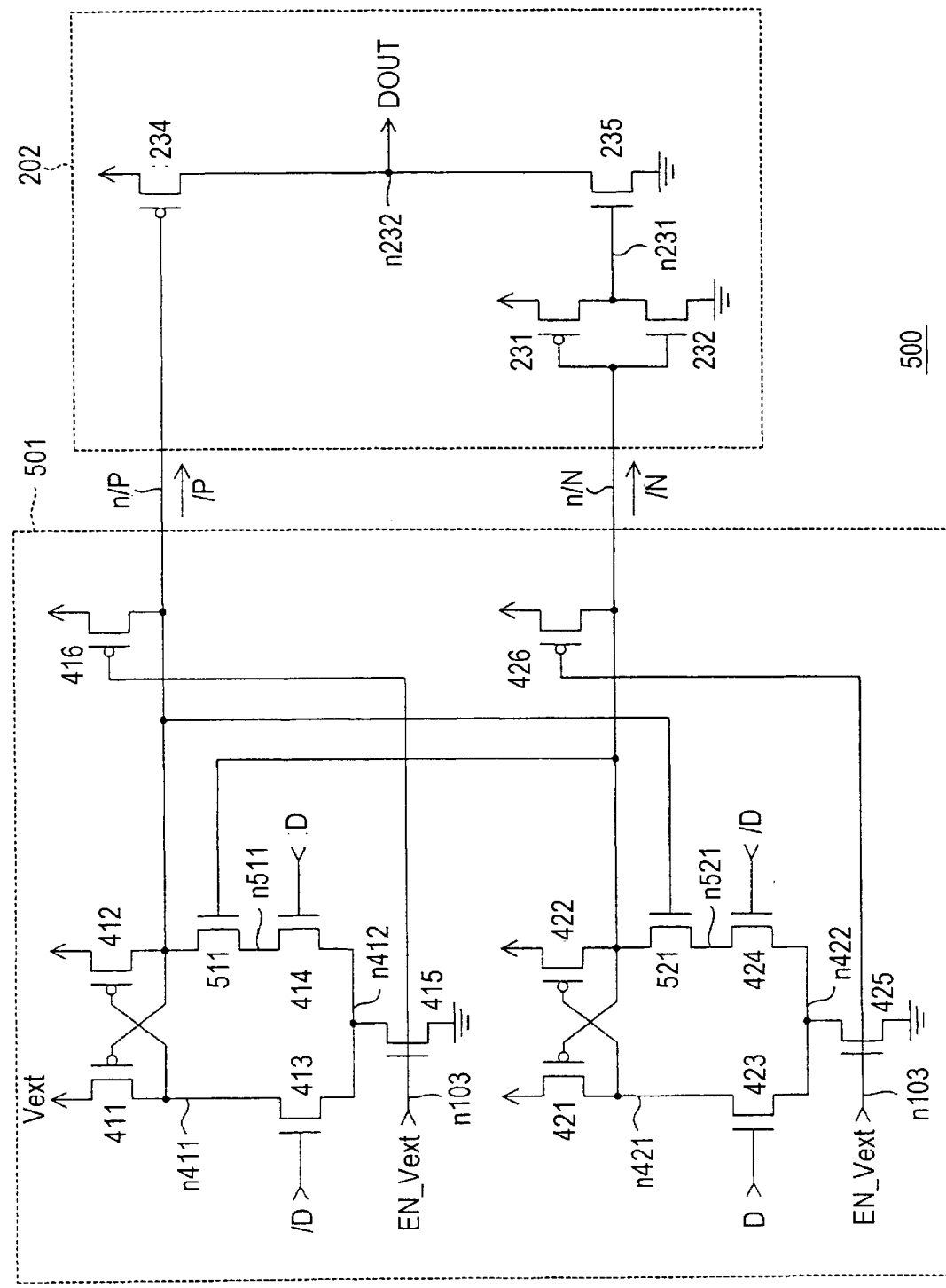
FIG. 7 is a circuit diagram showing the structure of a data output circuit which is set up in a semiconductor memory device according to the fourth embodiment of the invention.

As shown in FIG. 7, the data output circuit 500 is provided with an output control signal generation potion 501 and an output portion 202. This output portion 202 is identical to those which are adopted by the semiconductor memory device according to the first, second, and third embodiments of the invention as described above.

Similar to the output control signal generation portion 401 provided in the semiconductor memory device according to the third embodiment of the invention, the output control signal generation portion 501 receives the first output data determination signal D and the second output data determination signal /D both of which are outputted from a sense amplifier (not shown), and also receives a level shift enable signal EN_Vext outputted from the enable signal generation circuit 100.

Similar to the output control signal generation portion 401, the output control signal generation portion 501 includes the first circuit portion which forms the first output control signal /P based on the first output data determination signal D, the second output data determination signal /D, and the level shift enable signal EN_Vext, and outputs this first output control signal /P to the node n/P; and the second circuit portion which forms the second output control signal /N and outputs this signal /N to the node n/N. The first circuit portion is composed of P-transistors 411, 412, N-transistors 413, 414, 415, a P-transistor 416, and an N-transistor 511. The second circuit portion is composed of P-transistors 421, 422, N-transistors 423, 424, 425, a P-transistor 426, and an N-transistor 521. That is, the output control signal generation potion 501 can be achieved by adding the N-transistor 511 to the first circuit portion of the output control signal generation portion 401 and also adding the N-transistor 521 to the second circuit portion of the same.

Circuit elements forming the first circuit portion are electrically connected with each other as follows.

The source of the P-transistor 411 is connected with the supply line of the external voltage Vext, the drain of the same with the node n411, and the gate of the same with the node n/P. The source of the P-transistor 412 is connected with the supply line of the external voltage Vext, the drain of the same with the node n/P and the gate of the same with the node n411.

The source of the N-transistor 413 is connected with the node n412, the drain of the same with the node n411, and the gate of the same with the transmission line of the second output data determination signal /D. The source of the N-transistor 414 is connected with the node n412, the drain of the same with the node n511, and the gate of the same with the transmission line of the first output data determination signal D. The source of the N-transistor 415 is connected with the ground voltage GND line, the drain of the same with the node n412, and the gate of the same with the node n103.

The source of the P-transistor 416 is connected with the supply line of the external voltage Vext, the drain of the same with the node n/P, and the gate of the same with the node n103.

The source of the N-transistor 511 is connected with a node n511, the drain of the same with the node n/P and the gate of the same with the node n/N.

Circuit elements forming the second circuit portion are electrically connected with each other as follows.

The source of the P-transistor 421 is connected with the supply line of the external voltage Vext, the drain of the same with the node n421, and the gate of the same with the node n/N. The source of the P-transistor 422 is connected with the supply line of the external voltage Vext, the drain of the same with the node n/N, and the gate of the same with the node n421.

The source of the N-transistor 423 is connected with the node n422, the drain of the same with the node n421, and the gate of the same with the transmission line of the first output data determination signal D. The source of the N-transistor 424 is connected with the node n422, the drain of the same with the node n521, and the gate of the same with the transmission line of the second output data determination signal /D. The source of the N-transistor 425 is connected with the ground voltage GND line, the drain of the same with the node n422, and the gate of the same with the node n103.

The source of the P-transistor 426 is connected with the supply line of the external voltage Vext, the drain of the same with the node n/N, and the gate of the same with the node n103.

The source of the N-transistor 521 is connected with the node n521, and the drain of the same with the node n/N, and the gate of the same with the node n/P.

As describe above, both of the first and second circuit portion constituting the output control signal generation portion 501 are provided with an N-transistor input type differential amplification circuit, which becomes active when the level shift enable signal EN_Vext is at H-level. The first circuit portion sets the logical level of the node n/P to be at H-level or L-level in response to the logical level of the first output data determination signal D or the second output data determination signal /D. On one hand, the second circuit portion sets the logical level of the node n/N to be at H-level or L-level in response to the logical level of the first output data determination signal D or the second output data determination signal /D.

Furthermore, when the level shift enable signal EN_Vext is at L-level, the differential amplification circuit belonging to the first and second circuit portions becomes inactive, and the node n/P and the node n/N are set to be at H-level by the P-transistor 416 and P-transistor 426, respectively. With this, the node n232 belonging to the output portion 202 stays in the Hi-Z state.

The N-transistor 511 provided in the first circuit portion of the output control signal generation portion 501 and the N-transistor 521 provided in the second circuit portion of same form a feedback circuit of the flip-flop type. With this feedback circuit, one of nodes n/P and n/N is asserted when the other is negated. Therefore, there is no chance for both of nodes n/P and n/N to be asserted at the same time, in other words, there is no chance for both of the P-transistor 234 and N-transistor 235 in the output portion 202 to be turned on at the same time. Accordingly, there is prevented the generation of the penetration current from the power source to the ground via the P-transistor 234 and N-transistor 235.

In the next, the operation of the semiconductor memory device having the enable signal generation circuit 100 and the data output circuit 500 according to the four embodiment will be described with reference to FIG. 6.

<Before Time 1 and After Time t5>

When the level shift enable signal EN_Vext is at L-level, N-transistors 415 and 425 belonging to the output control signal generation portion 501 are turned off, while P-transistors 416 and 426 belonging to the same are turned on. Because of this, both of nodes n/P and n/N are equally fixed at H-level, while both of the P-transistor 234 and N-transistor 235 belonging to the output portion 202 are equally turned off, thereby the node n232 staying in the Hi-Z state. Furthermore, as the node n/P is at H-level, the N-transistor 521 belonging to the second circuit portion stays in the ON state, and similarly, as the node n/H is at H-level, the N-transistor 511 belonging to the first circuit portion stays in the ON state.

<At Time t1>

As the first output data determination signal D is at H-level and the second output data determination signal /D is at L-level, the N-transistor 413 belonging to the first circuit portion of the output control signal generation portion 501 stays in the OFF state while the N-transistor 414 belonging to the same stays in the ON state. On one hand, the N-transistor 423 belonging to the second circuit portion of the output control signal generation portion 501 stays in the ON state while the N-transistor 424 belonging to the same stays in the OFF state.

At this place, on the side of the first circuit portion, if the level shift enable signal EN_Vext makes the logical level transition of L-to-H, the N-transistor 415 is turned on and the P-transistor 416 is turned off, thereby the node n/P making the logical level transition of H-to-L. When the node n/P is at L-level, the P-transistor 411 stays in the ON state and the node n411 makes the logical level transition to H-level, thus the P-transistor 412 staying in OFF state. Consequently, the node n/P is fixed at L-level while the node n411 is fixed at H-level.

On one hand, on the side of the second circuit portion, the N-transistor 425 is turned on and the P-transistor 426 is turned off. With this, the node n421 makes the logical level transition to L-level. When the node n421 is at L-level, the P-transistor 422 stays in the ON state, so that the node n/N holds the H-level state and the P-transistor 421 holds the OFF state. As the node n/P on the first circuit portion is at L-level, the N-transistor 521 belonging to the second circuit portion stays in the OFF state.

As the node n/P is at L-level and the node n/N is at H-level, the P-transistor 234 belonging to the output portion 202 is turned on and the N-transistor 235 is turned off. As a result, the output signal DOUT of H-level is outputted from the node 232.

<At Time t2>

If the first output data determination signal D makes the logical level transition of H-to-L and the second output data determination signal /D makes the logical level transition of L-to-H, the N-transistor 413 on the side of the first circuit portion of the output control signal generation portion 501 is turned on, and the N-transistor 414 on the same side is turned off. And also, the node n411 makes the logical level transition of H-to-L, and the P-transistor 412 on the same side is turned on. With this, the node n/P makes the logical level transition of L-to-H and the P-transistor 411 is turned off, and the N-transistor 521 belonging to the second circuit portion is turned on.

On one hand, on the side of the second circuit portion, the N-transistor 423 is turned off and the N-transistor 424 is turned on. At this point of time, the node n/N is connected with the ground through N-transistors 521, 424 and 425 and makes the logical level transition of H-to-L. In this case, the N-transistor 521 is turned on only after the node n/P has become H-level, so that there is no case that the node n/N makes the logical level transition to L-level before the node n/P makes the logical level transition to H-level. When the node n/N makes the logical level transition to L-level, the P-transistor 421 is turned on and the node n421 makes the logical level transition of L-to-H, thereby the P-transistor 422 is turned off. Furthermore, the N-transistor 511 belonging to the first circuit portion is turned off.

As the node n/P is at H-level and the node n/N is at L-level, the P-transistor 234 belonging to the output portion 202 is turned off and the N-transistor 235 is turned on. As a result, the output signal DOUT of L-level is outputted from the node n232. As described in the above, the node n/N does not make the logical level transition to L-level before the node n/P makes logical level transition to H-level. In other words, there is neither the case that the nodes n/P and n/N become L-level at the same time, nor the case the P-transistor 234 and the N-transistor 235 stay in ON stage at the same time. As the result of this, there is prevented the generation of the penetration current from the power source to the ground via the P-transistor 234 and N-transistor 235.

<At Time t3>

If the first output data determination signal D makes the logical level transition of L-to-H and the second output data determination /D makes the logical level transition of H-to-L, the N-transistor 413 is turned off and the N-transistor 414 is turned on in the first circuit portion of the output control signal generation portion 501. However, the N-transistor 511 is not turned on unless the node n/N of the second circuit portion makes logical level transition to H-level.

On one hand, on the side of the second circuit portion, the N-transistor 423 is turned on while the N-transistor 424 is turned off. Furthermore, the node n421 makes the logical level transition of H-to-L and the P-transistor 422 is turned on. With this, the node n/N makes the logical level transition of L-to-H, the P-transistor 421 is turned off, and further the N-transistor 511 belonging to the first circuit portion is turned on.

At this point of time, in the first circuit portion, as all of N-transistors 511, 414 and 415 are turned on, the node n/P is connected with the ground and makes the logical level transition of H-to-L. In other words, the node n/P is not allowed to make the logical level transition to L-level before the node n/N makes the logical level transition to H-level. When the node n/P makes the logical level transition to L-level, the P-transistor 411 is turned on, the node n411 makes the logical level transition of L-to-H, and the P-transistor 412 is turned off. Furthermore, the N-transistor 521 belonging to the second circuit portion is also turned off.

As the node n/P is at L-level and the node n/N is at H-level, the P-transistor 234 belonging to the output portion 202 is turned on and the N-transistor 235 is turned off. As a result, the output signal DOUT of H-level is outputted from the node n232. As described above, the node n/P is not allowed to make the logical level transition to L-level before the node n/N makes the logical level transition to H-level. In other words, there is neither the case that the nodes n/P and n/N become L-level at the same time, nor the case the P-transistor 234 and the N-transistor 235 stay in ON stage at the same time. As the result of this, there is prevented the generation of the penetration current from the power source to the ground via the P-transistor 234 and N-transistor 235.

<At Time t4>

Again, if the first output data determination signal D makes the logical level transition of H-to-L and the second output data determination /D makes the logical level transition of L-to-H, the output control signal generation portion 501 and the output portion 202 execute the same operation as that at time t2. As a result, the output signal DOUT of L-level is outputted from the node n232. At this time, there is also prevented the generation of the penetration current from the power source to the ground via the P-transistor 234 and N-transistor 235.

<At Time t5>

If the level shift enable signal EN__Vext makes the logical level transition of H-to-L, the N-transistor 415 on the side of the first circuit portion is turned off and the P-transistor 416 is turned on, thereby the node n/P being fixed at H-level. Similarly, on the side of the second circuit portion, the N-transistor 425 is turned off and the P-transistor 426 is turned on, thereby the node n/N being also fixed at H-level. As nodes n/P and n/N are equally at H-level, the P-transistor 234 and N-transistor 235 belonging to the output portion 202 are equally turned off and the node n232 stays in the Hi-Z state.

As described above, according to the semiconductor memory device by the fourth embodiment of the invention, which is provided with the enable signal generation circuit 100 and the data output circuit 500, similar to the semiconductor memory device according to the first, second and third embodiments of the invention, it becomes possible to generate the output signal DOUT swinging between the external voltage Vext and the ground voltage GND, based on the first output data determination signal D and the second output data determination /D, both of which swing between the internal voltage Vint and the ground voltage GND.

Furthermore, the semiconductor memory device according to the fourth embodiment of the invention can realize the high speed data read similar to the semiconductor memory device according to the third embodiment of the invention.

Still further, the semiconductor memory device according to the fourth embodiment of the invention can prevent the penetration current flowing from the power source to the ground through the P-transistor 234 and the N-transistor 235. As the result of this, all the more reduction of the power consumption can be realized. Moreover, the circuit elements to be added for realizing the function like this are only two transistors, that is, the N-transistors 511 and 521. Thus, there can be minimized the increase in the circuit element layout area of the semiconductor memory device.

Certain preferred embodiments according to the invention relating to the semiconductor memory device have been described in detail by way of examples and with reference to the accompanying drawings. However, the invention is not limited to such examples. It is apparent that any one who has an ordinary skill in the art is able to make various changes and modifications within the technical thoughts as recited in the scope of claim for patent as per attached hereto, and it is understood that those changes and modifications belong to the technical scope of the invention, naturally.

As has been discussed in the above, according to the invention, there can be realized the circuit scale reduction of the data output circuit, enhancement of the data read speed, and reduction of the power consumption.

What is claimed is:

1. A semiconductor memory device comprising:

an output portion applying a first power source voltage to a read data output node when a voltage level of a first output control node is in an active state, and applying a first power source reference voltage to said read data output node when a voltage level of a second output control node is in an active state; and an output control portion receiving a first output data determination signal which makes a power source voltage transition to a second power source voltage or a second power source reference voltage depending on information stored in a selected memory cell, a second output data determination signal which makes a power source voltage transition to said second power source reference voltage when said first output data determination signal makes the power source voltage transition to said second power source voltage, and which makes the power source voltage transition to said second power source voltage when said first output data determination signal makes the power source voltage transition to said second power source reference voltage, and an enable signal making a power source voltage transition to said first power source voltage or said first power source reference voltage, said output control portion making the voltage level of said first output control node be in the active state when said enable signal makes the power source voltage transition to said first power source voltage and said first output data determination signal makes the power source voltage transition to said second power source voltage, and making the voltage level of said second output control node be in the active state when said enable signal makes the power source voltage transition to said first power source voltage and said second output data determination signal makes the power source voltage transition to said second power source voltage, wherein said output control portion includes a first latch that latches the voltage level of said first output control node in an inactive state and a second latch that latches the voltage level of said second output control node in the inactive state, wherein said first power source voltage is an external power source voltage of the semiconductor memory device, said first power source reference voltage is a ground voltage, said second power source voltage is an internal power source voltage of the semiconductor memory device, and said second power source reference voltage is a ground voltage.

2. A semiconductor memory device as claimed in claim 1, wherein said first latch detects that the voltage level of said second output control node is in the active state, and latches the voltage level of said first output control node in the inactive state, and said second latch detects that the voltage level of said first output control node is in the active state, and latches the voltage level of said second output control node in the inactive state.

3. A semiconductor memory device as claimed in claim 2, wherein said first latch is a P-channel transistor having a source connected with the supply line of said first power source voltage, a drain connected with said first output control node, and a gate connected with said second output control node.

4. A semiconductor memory device as claimed in claim 2, wherein said second latch is a P-channel transistor having a source connected with the supply line of said first power source voltage, a drain connected with said second output control node, and a gate connected with said first output control node.

5. A semiconductor memory device as claimed in claim 1, wherein if the voltage level of said first output control node makes a state transition to the active state, said first latch stays in a reset state, and if the voltage level of said second output control node makes a state transition to the active state, said second latch stays in a reset state.

6. A semiconductor memory device as claimed in claim 5, wherein said first latch comprises:

a P-channel transistor having a source connected with the supply line of said first power source voltage and a drain connected with said first output control node; and an inverter having an input terminal connected with said first output control.

7. A semiconductor memory device as claimed in claim 5, wherein said second latch comprises:

a P-channel transistor having a source connected with the supply line of said first power source voltage and a drain connected with said second output control node; and an inverter having an input terminal connected with said second output control node and an output terminal connected with a gate of said P-channel transistor.

8. A semiconductor memory device, comprising:

an output portion applying a first power source voltage to a read data output node when a voltage level of a first output control node is in an active state, and applying a first power source reference voltage to said read data output node when a voltage level of a second output control node is in an active state; and an output control portion receiving a first output data determination signal which makes a power source voltage transition to a second power source voltage or a second power source reference voltage depending on information stored in a selected memory cell, a second output data determination signal which makes a power source voltage transition to said second power source reference voltage when said first output data determination signal makes the power source voltage transition to said second power source voltage, and which makes the power source voltage transition to said second power source voltage when said first output data determination signal makes the power source voltage transition to said second power source reference voltage, and an enable signal making a power source voltage transition to said first power source voltage or said first power source reference voltage, said output control portion making the voltage level of said first output control node be in the active state when said enable signal makes the power source voltage transition to said first power source voltage and said first output data determination signal makes the power source voltage transition to said second power source voltage, and making the voltage level of said second output control node be in the active state when said enable signal makes the power source voltage transition to said first power source voltage and said second output data determination signal makes the power source voltage transition to said second power source voltage, wherein said output control portion includes a first latch that latches the voltage level of said first output control node in an inactive state and a second latch that latches the voltage level of said second output control node in the inactive state, wherein said output control portion comprises
 a first transistor arranged to apply said first power source voltage to said first output control node,
 second and third transistors arranged in series to apply said first power source reference voltage to said first output control node,
 a fourth transistor arranged to apply said first power source voltage to said second output control node, and
 fifth and sixth transistors arranged in series to apply said first power source reference voltage to said second output control node,
 wherein said first, second, fourth, and fifth transistors are on/off controlled by said enable signal,
 said third transistor is on/off controlled by said first output data determination signal, and
 said sixth transistor is on/off controlled by said second output data determination signal.

9. A semiconductor memory device as claimed in claim 8, wherein said first transistor is a P-channel type transistor having a source connected with a supply line of said first power source voltage, a drain connected with said first output control node, and a gate connected with a transmission line of said enable signal, and said fourth transistor is a P-channel type transistor having a source connected with the supply line of said first power source voltage, a drain connected with said second output control node, and a gate connected with the transmission line of said enable signal.

10. A semiconductor memory device as claimed in claim 8, wherein said second transistor is an N-channel type transistor having a source connected with a supply line of said first power source reference voltage, a drain connected with a source of said third transistor, and a gate connected with the transmission line of said enable signal, said third transistor is an N-channel type transistor having a drain connected with said first output control node, and a gate connected with a transmission line of said first output data determination signal, said fifth transistor is an N-channel type transistor having a source connected with the supply line of said first power source reference voltage, a drain connected with a source of said sixth transistor, and a gate connected with the transmission line of said enable signal, and said sixth transistor is an N-channel transistor having a drain connected with said second output control node and a gate connected with a transmission line of said second output data determination signal.

11. A semiconductor memory device comprising:
an output portion applying a first power source voltage to a read data output node when a voltage level of a first output control node is in an active state, and applying a first power source reference voltage to said read data output node when a voltage level of a second output control node is in an active state; and an output control portion receiving
 a first output data determination signal which makes a power source voltage transition to a second power source voltage or a second power source reference voltage depending on information stored in a selected memory cell,
 a second output data determination signal which makes a power source voltage transition to said second power source reference voltage when said first output data determination signal makes the power source voltage transition to said second power source voltage, and which makes the power source voltage transition to said second power source voltage when said first output data determination signal makes the power source voltage transition to said second power source reference voltage, and
 an enable signal making a power source voltage transition to said first power source voltage or said first power source reference voltage,
 said output control portion making the voltage level of said first output control node be in the active state when said enable signal makes the power source voltage transition to said first power source voltage and a first voltage difference exists between said first output data determination signal and said second output data determination signal, and making the voltage level of said second output control node be in the active state when said enable signal makes the power source voltage transition to said first power source voltage and a second voltage difference exists between said first output data determination signal and said second output data determination signal,
 wherein said output control portion includes a first latch that latches the voltage level of said first output control node in an inactive state and a second latch that latches the voltage level of said second output control node in the inactive state,
 wherein said first power source voltage is an external power source voltage of the semiconductor memory device, said first power source reference voltage is a ground voltage, said second power source voltage is an internal power source voltage of the semiconductor memory device, and said second power source reference voltage is a ground voltage.

12. A semiconductor memory device as claimed in claim 11 wherein said output control portion detects said first voltage difference only when said second output control node is in the inactive state, and detects said second voltage difference only when said first output control node is in the inactive state.

13. A semiconductor memory device as claimed in claim 11, wherein said output control portion comprises:
- a first differential amplification circuit that adjusts the voltage level of said first output control node in response to a voltage difference between said first output data determination signal and said second output data determination signal; and
- a second differential amplification circuit that adjusts the voltage level of said second output control node in response to a voltage difference between said first output data determination signal and said second output data determination signal.

14. A semiconductor memory device as claimed in claim 11, wherein said first latch detects that said enable signal makes the power source voltage transition to said first power source reference voltage, and latches the voltage level of said first output control node in the inactive state, and said second latch detects that said enable signal makes the power source voltage transition to said first power source reference voltage, and latches the voltage level of said second output control node in the inactive state.

15. A semiconductor memory device as claimed in claim 14, wherein said first latch is a P-channel transistor having a source connected with a supply line of said first power source voltage, a drain connected with said first output control node, and a gate connected with a transmission line of said enable signal.

16. A semiconductor memory device as claimed in claim 14, wherein said second latch is a P-channel transistor having a source connected with a supply line of said first power source voltage, a drain connected with said second output control node, and a gate connected with a transmission line of said enable signal.

17. A semiconductor memory device comprising:
- an output control signal generator that receives first and second data determination signals that transition between a ground voltage and an internal reference voltage depending on information stored in a selected memory cell and that receives an enable signal that has been shifted to transition between the ground voltage and an external reference voltage,
- said output control signal generator providing a first output control signal responsive to transitions of the first data determination signal and the enable signal, and providing a second output control signal responsive to transitions of the second data determination signal and the enable signal; and
- an output circuit that provides a read data output signal that transitions between the ground voltage and the external reference voltage responsive to first and second output control signals.

18. The semiconductor memory device of claim 17, further comprising a latch circuit that respectively latches the first output control signal and the second output control signal to the external reference voltage.

19. The semiconductor memory device of claim 18, said latch circuit comprises:
- a first latch that latches the first output control signal to the external reference voltage responsive to an inactive state of the second output control signal; and
- a second latch that latches the second output control signal to the external reference voltage responsive to an inactive state of the first output control signal.

20. The semiconductor memory device of claim 18, wherein said latch circuit respectively latches the first and second output control signals responsive to the enable signal.

* * * * *